Oct. 4, 1960 | J. R. MACDONALD | 2,955,256

CONSTANT CURRENT AMPLIFIER

Filed Sept. 4, 1957

INVENTOR

*James Ross Macdonald*

BY *Stevens, Davis, Miller & Mosher*

ATTORNEYS

United States Patent Office 2,955,256

Patented Oct. 4, 1960

2,955,256

CONSTANT CURRENT AMPLIFIER

James Ross Macdonald, Dallas, Tex., assignor to Texas Instruments Incorporated, Dallas, Tex., a corporation of Delaware Filed Sept. 4, 1957, Ser. No. 682,058

1 Claim. (Cl. 330—3)

This invention relates to an improved pentode amplifier circuit and a novel constant current device, which device constitutes a new use of a semiconductor diode.

The utility of two terminal constant current devices was pointed out in the copending application, James Ross Macdonald, Serial No. 429,447, filed May 13, 1954 which is hereby incorporated by reference. In that application, the constant-current device comprises an internally biased field-effect transistor. It was pointed out in the aforementioned application that two terminal constant current devices are of particular utility in obtaining high amplification when used as the load resistor of pentodes. According to the present invention, a reversed biased semiconductor diode is used as the constant current device. This diode may be of the grown junction type, diffused, grown-diffused, fused, surface barrier or other type. The diode is used in place of a load resistor for a pentode amplifier. When the diode is biased with the proper reverse voltage, it will be in a constant current portion of its characteristic. The current will not increase appreciably as the voltage applied is increased until breakdown is approached. The value of the current over this constant current region is called the $I_{co}$. Thus by properly biasing the diode in the reverse direction, an efficient two terminal constant current device is obtained.

The objects and advantages of the invention will be better understood with reference to the following drawings.

Figure 1:
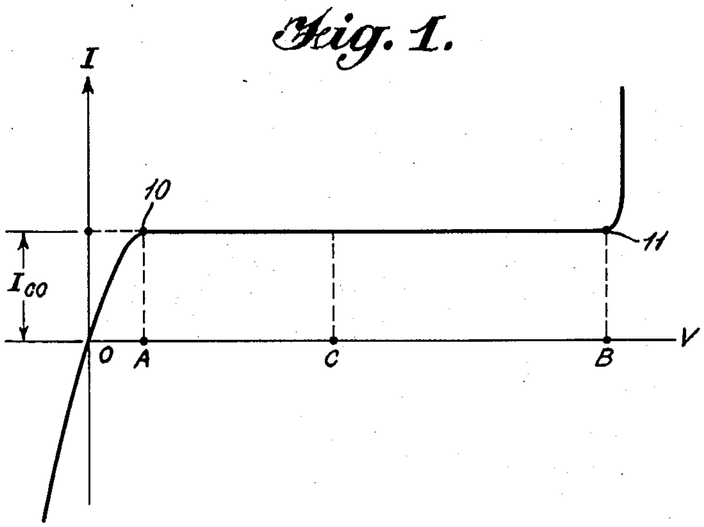
Figure 1 shows the voltage current characteristic of the semiconductor junction diode.

The characteristic shown in Figure 1 indicates that relatively constant currents are obtained for a substantial variation of voltages. The characteristic has been shown so that the high resistance or reverse direction of current and voltage with respect to the diode is positive and hence this part of the characteristic is in the first quadrant. If the reverse voltage is increased beyond the point A, the current reaches a limiting value and further increases in voltage will result in no substantial increase in current until the reverse voltage approaches point B where the diode breaks down. It is this value of reverse current between point A and B which is known as the $I_{co}$. For convenience, the $I_{co}$ region of the voltage current characteristic shall be defined as that part of the characteristic between a point 10 where the voltage ordinate A intersects the characteristic and a point 11 where the voltage ordinate B intersects the characteristic. It can be seen from the characteristic that if the semiconductor junction diode is biased with a voltage C, the diode will operate as a constant current device for substantial swings of applied voltage.

In the preferred embodiment, the p-n junction diode 1 is made of germanium. By using this particular semiconductor, it is possible to obtain almost ideal reverse current characteristics. The lower voltage limit of the $I_{co}$ region of the voltage current characteristic of a germanium junction diode is approximately 0.2 volts. By using a relatively large area germanium diode and by proper physical construction designed to maximize the diode area, $I_{co}$'s from 0.5 to 1 milliampere can be obtained. Ten micro-amps or more is enough current to operate many pentodes or triodes quite adequately.

Figure 2:
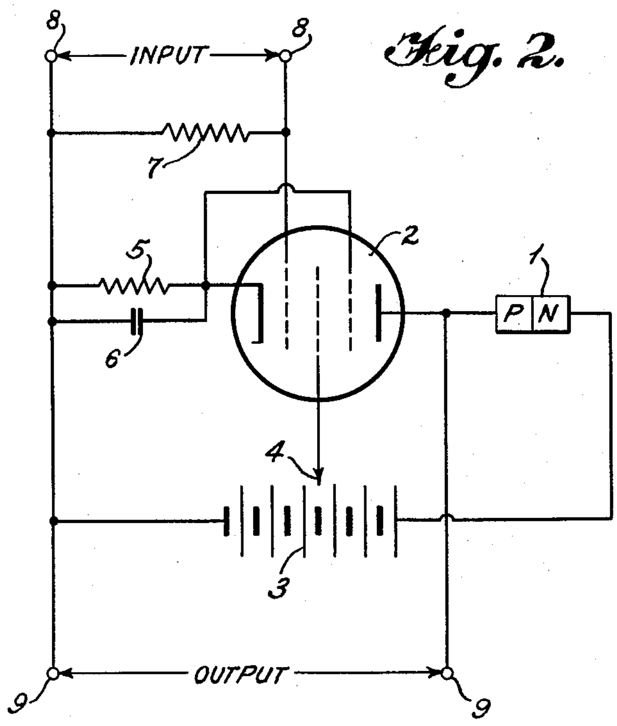
Figure 2 shows the diode used as a constant current device in place of the load resistor in a pentode amplifier circuit.

In the circuit shown in Figure 2, a semiconductor diode 1 having a p section and an n section is connected to the plate of a pentode 2, the connection being made to the p section of the diode. The n section of the diode 1 is connected to the positive terminal of a biasing battery 3 which provides both the bias for the diode 1 and the plate supply for the pentode 2. With the diode connected in this manner, it is biased in the reverse direction. An adjustable tap 4 on the battery 3 is connected to the screen grid of the pentode 2. The tap 4 is adjusted to provide the proper bias for the screen grid. The cathode of the pentode 2 is connected to the negative terminal of the battery 3 over the parallel circuit of the cathode resistor 5 and the by-pass condenser 6. The cathode is also connected directly to the suppressor grid of the pentode 2. A grid resistor 7 connects the control grid of the pentode 2 to the negative terminal of the battery 3. The input signal to be amplified is applied directly across the grid resistor 7 from terminals 8. The output voltage is taken from terminals 9 which are connected to the plate of the pentode 2 and to the negative terminal of the battery 3. Ordinarily the negative terminal of battery 3 would be grounded so that the output would be taken from the plate of pentode 2 and ground. This circuit thus is a conventional pentode amplifier circuit with the diode 1 connected in place of the load resistor. The voltage of the battery 3 is selected to be of such a value that the diode 1 will be biased in the $I_{co}$ region of the voltage current characteristic when there is no voltage applied to the grid of the pentode 2, that is when the grid is at the same potential as the negative terminal of the battery 3. This pentode circuit, using the diode as a constant current device, will yield a very high gain relative to the gain which would be obtained if an ordinary load resistor were used.

The above disclosure is a description of a specific embodiment of the invention. It is contemplated that numerous modifications could be made to the disclosure of the invention, which is to be limited only as defined in the appended claims.

What is claimed is:

In an amplifier, an electron discharge amplifying element and a load circuit connected to said element, said load circuit consisting of a semiconductor diode reverse biased to operate within the $I_{co}$ region of its voltage-current characteristic.

References Cited in the file of this patent

UNITED STATES PATENTS

| | | |
|---|---|---|
| 2,714,702 | Shockley | Aug. 2, 1955 |
| 2,730,576 | Caruthers | Jan. 10, 1956 |
| 2,751,545 | Chase | June 19, 1956 |
| 2,773,136 | Futterman | Dec. 4, 1956 |

OTHER REFERENCES

Text, "Vacuum Tube Amplifiers," by Valley and Wallman, 1948, pages 432–439 (see first three lines of last paragraph of page 433).

Text, "Principles of Transistor Circuits," by Shea, 1953, pages 8, 9 and 10 (see last paragraph of page 8).

Text, "Transistor Electronics," by Lo et al., 1953 (first printing) pages 18, 19, 20. (See top of page 19.)